(12) United States Patent
Liu et al.

(10) Patent No.: US 8,431,961 B2
(45) Date of Patent: Apr. 30, 2013

(54) MEMORY DEVICES WITH A CONNECTING REGION HAVING A BAND GAP LOWER THAN A BAND GAP OF A BODY REGION

(75) Inventors: Haitao Liu, Meridian, ID (US); Jian Li, Boise, IA (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 272 days.

(21) Appl. No.: 13/020,337

(22) Filed: Feb. 3, 2011

(65) Prior Publication Data
US 2012/0199877 A1 Aug. 9, 2012

(51) Int. Cl.
*H01L 29/66* (2006.01)
(52) U.S. Cl.
USPC .................................. 257/192; 257/E29.255
(58) Field of Classification Search .................... 257/192
See application file for complete search history.

(56) References Cited

U.S. PATENT DOCUMENTS

| | | | |
|---|---|---|---|
| 5,932,889 A | 8/1999 | Matsumura et al. | |
| 6,013,928 A * | 1/2000 | Yamazaki et al. | 257/347 |
| 6,313,487 B1 | 11/2001 | Kencke et al. | |
| 7,554,854 B2 | 6/2009 | Osame et al. | |
| 2004/0157353 A1 * | 8/2004 | Ouyang et al. | 438/38 |
| 2007/0235793 A1 | 10/2007 | Yamazaki et al. | |
| 2007/0252149 A1 * | 11/2007 | Yamazaki et al. | 257/59 |
| 2009/0121258 A1 * | 5/2009 | Kumar | 257/192 |
| 2009/0310431 A1 * | 12/2009 | Saito | 365/207 |
| 2010/0200916 A1 * | 8/2010 | Gossner et al. | 257/335 |
| 2011/0140087 A1 * | 6/2011 | Hellings et al. | 257/24 |

* cited by examiner

*Primary Examiner* — Robert J Hoffberg
*Assistant Examiner* — Igwe U Anya
(74) *Attorney, Agent, or Firm* — Schwegman Lundberg & Woessner, P.A.

(57) ABSTRACT

Memory devices are shown that include a body region and a connecting region that is formed from a semiconductor with a lower band gap than the body region. Connecting region configurations can provide increased gate induced drain leakage during an erase operation. Configurations shown can provide a reliable bias to a body region for memory operations such as erasing, and containment of charge in the body region during a boost operation.

27 Claims, 4 Drawing Sheets

MEMORY DEVICES WITH A CONNECTING REGION HAVING A BAND GAP LOWER THAN A BAND GAP OF A BODY REGION

BACKGROUND

Higher memory density is always in demand to provide smaller devices with higher memory capacity. Forming memory devices laterally on a surface of a semiconductor chip uses a great deal of chip real estate. Improved memory devices are needed with new configurations to further increase memory density beyond traditional laterally formed memory devices.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical, material changes, etc. may be made.

The term "horizontal" as used in this application is defined as a plane parallel to the conventional plane or surface of a substrate, such as wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1:
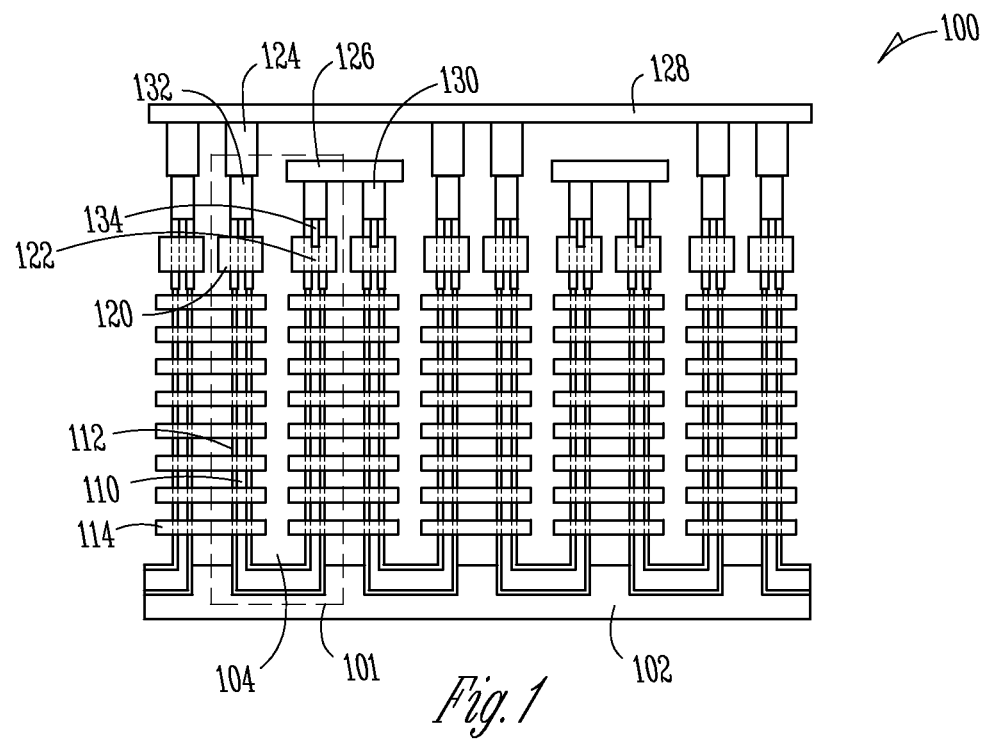
FIG. 1 shows a memory device according to an embodiment of the invention.

FIG. 1 shows a memory device 100 formed on a substrate 102. A charge storage layer(s) 112 (e.g., a combination of a tunnel dielectric layer, a polysilicon layer, and a charge blocking layer; a combination of a nitride layer, an oxide layer, and a nitride layer; or other any other layer or combination of layers that can provide a charge storage function, whether currently known or future developed), substantially surrounds an elongated body region 110 to form a respective charge structure corresponding to each of a plurality of gates 114 (which may also substantially surround respective cross sections of the elongated body region 110 and charge storage layer(s) 112). A first select gate 120 and a second select gate 122 are shown to selectively electrically couple the elongated body region 110 to a drain region 132 and a source region 130, respectively. A dielectric 104 can fill in spaces between components such as those described above.

FIG. 1 shows an embodiment where the elongated body region 110 forms a "U" shape with a pair of upward facing ends. Another example configuration (not shown) includes a linear, vertical, elongated body region 110 with one end facing upward, and the other end facing downward. Another example configuration (not shown) includes a horizontal, linear, elongated body region 110 with ends on either side. Embodiments with two upward facing ends, such as the substantially "U" shaped configuration, can enable easier formation of some components at the ends of the elongated body region 110 during manufacture, compared to embodiments where components are formed deeper in the structure.

In one example, the elongated body region 110 is formed from a p type semiconductor material. A source region 130 and a drain region 132 are shown coupled to a first end 111 and a second end 113 of the elongated body region 110, respectively. In one example, the source region 130 and the drain region include n type semiconductor material, such as n+ polysilicon. In operation, the pathway of source region 130, to elongated body region 110, to drain region 132 acts as an n-p-n transistor, with select gates 120, 122, and gates 114 operating to allow, or inhibit signal transmission along the way. In the example shown, the source region 130, elongated body region 110, drain region 132, select gates 120, 122, and gates 114 collectively form a memory cell string 101.

A source line 126 and a data line, such as bitline 128 are shown coupled to the source region 130 and the drain region 132 respectively. In one embodiment, a plug 124 is used to couple the bitline 128 to the drain region 132. Accordingly, the drain region 132 could be described as being "indirectly coupled" to the bitline 128 in such an embodiment. Each of the source line 126, bitline 128 and plug 124 can comprise, consist of, or consist essentially of metal, such as aluminum, copper, or tungsten, or alloys of these or other conductor metals. In the present disclosure, the term "metal" further includes metal nitrides, or other materials that operate primarily as conductors.

Figure 2:
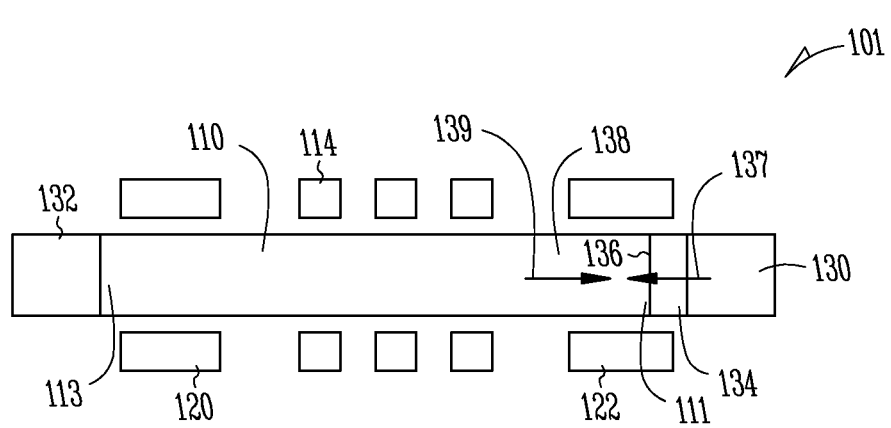
FIG. 2 shows a block diagram of a portion of the memory device from FIG. 1 according to an embodiment of the invention.

FIG. 2 shows a block diagram of memory cell string 101 from FIG. 1. In one embodiment, a connecting region 134 is located between the source region 130 and the body region 110, and is used to couple the source region 130 to the body region 110. For example, the connecting region 134 can be directly coupled on one end to the source region 130 and on another end to the body region 110. In one embodiment, the connecting region 134 comprises, consists of, or consists essentially of a semiconductor material with a band gap that is lower than a band gap of a semiconductor material used to form the body region 110. In one example, the body region comprises, consists of, or consists essentially of silicon. In one example, body region is formed from p type silicon. Silicon has a band gap of approximately 1.11 eV.

A number of example materials for the connecting region 134 with band gaps lower than silicon include germanium (approximately 0.67 eV), gallium antimonide (approximately 0.7 eV), indium nitride (approximately 0.7 eV), indium arsenide (approximately 0.36 eV), lead sulfide (approximately 0.37 eV), lead selenide (approximately 0.27 eV), lead telluride (approximately 0.29 eV), and silicon germanium.

In one or more embodiments, the connecting region 134 comprises, consists of, or consists essentially of epitaxial silicon germanium. Silicon germanium is suited for use with silicon due to a close lattice match and compatibility with existing silicon processing equipment. Silicon germanium can be expressed as $Si_xGe_{1-x}$ with x indicating the alloy fraction of each component. As x changes, the band gap of silicon germanium changes. Several alloy combinations of silicon germanium exhibit a band gap that is lower than silicon. In one example, the silicon germanium includes $Si_xGe_{1-x}$ where x is between 0.2 and 0.8. In one example, the silicon germanium includes $Si_xGe_{1-x}$ where x is between 0.4 and 0.6. In one example, the silicon germanium includes $Si_xGe_{1-x}$ where x is approximately 0.5.

In embodiments where the connecting region 134 has a band gap that is lower than a band gap of the body region, an increased gate induced drain leakage is possible at the interface 136 between the connecting region 134 and the body region 110. The gate induced drain leakage of the FIG. 2 configuration is increased in comparison to a configuration with only the body region 110 semiconductor material present adjacent to the source select gate 122. The increased gate induced drain leakage in direction 137 provides more reliable charge flow into the body region 110 to bias the body region. A reliable bias voltage is desirable in a number of memory operations, such as erase operations, where large voltage differences are used.

In memory cell strings 101 that are not selected for an erase operation, the body regions 110 of the non-selected strings 101 may be biased using a boost operation to inhibit the charge storage structures of the non-selected strings from being erased. In a boost operation, a voltage is applied to the body region 110, at least in part, through capacitive coupling of the body region to an applied voltage on the gates 114. For example 10 volts may be placed on the gates 114, and some amount of that bias voltage (around 7 volts for example) is transferred to the body region 110 through coupling.

Using a boost operation, it is desirable to maintain charge within the body region 110. As a result, a low gate induced drain leakage is desirable during a boost operation. In FIG. 2, an edge 138 of the body region 110 adjacent to source select gate 122 is formed from silicon or another semiconductor material with a band gap higher than the connecting region 134. A gate induced drain leakage in direction 139 at the edge 138 during a boost operation is low compared to a gate induced drain leakage in direction 137 at interface 136 during an erase operation.

Using configurations with materials of differing band gaps as described above provides reliable biasing of the body region 110 during an erase operation, and also reliable charge maintenance in the body region 110 during a boost operation.

Figure 3:
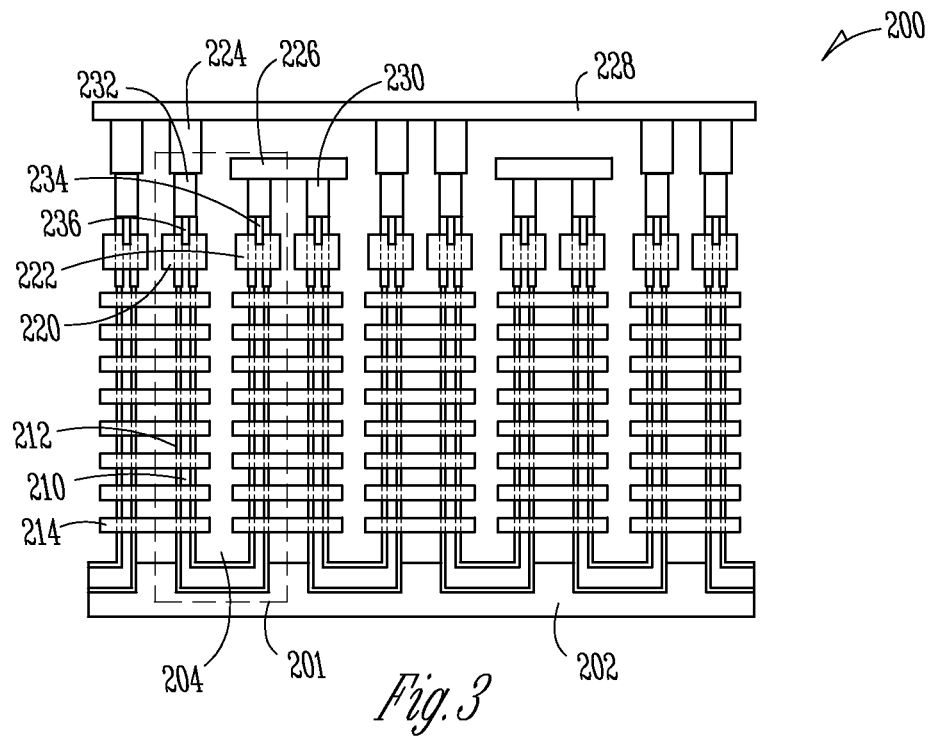
FIG. 3 shows another memory device according to an embodiment of the invention.

FIG. 3 shows a memory device 200 formed on a substrate 202. A charge storage layer(s) 212 substantially surrounds an elongated body region 210 to form a respective charge structure corresponding to each of a plurality of gates 214 (which may also substantially surround respective cross sections of the elongated body region 210 and charge storage layer(s) 212). A first select gate 220 and a second select gate 222 are shown to selectively couple the elongated body region 210 to a drain region 232 and a source region 230, respectively. A dielectric 204 can fill in spaces between components such as those described above In the example shown, 1 source region 230, elongated body region 210, drain region 232, select gates 220, 222, and gates 214 collectively form a memory cell string 201.

Similar to embodiments described above, a source line 226 and a bitline 228 are shown coupled to the source region 230 and the drain region 232 respectively. In one embodiment, a plug 224 is used to couple the bitline 228 to the drain region 232.

Figure 4:
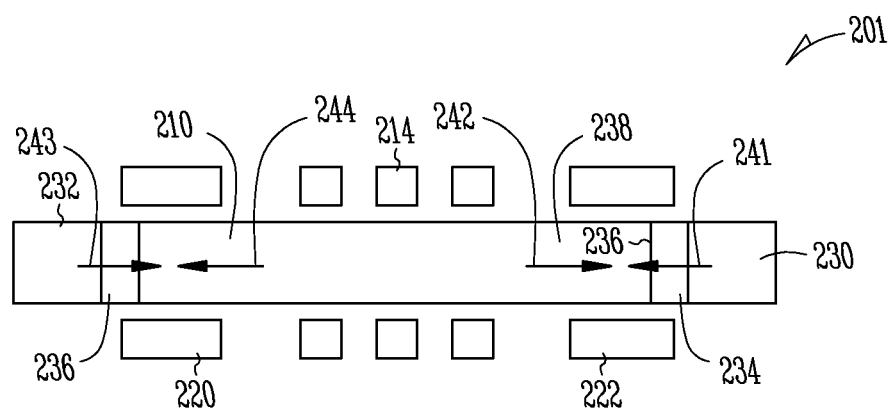
FIG. 4 shows a block diagram of a portion of the memory device from FIG. 3 according to an embodiment of the invention.

FIGS. 1 and 2 illustrated embodiments of a memory device 100 with a source connecting region 134 located only at a source end of a body region 110. FIG. 3 illustrates a memory device 200 that includes a source connecting region 234 coupling a body region 210 to a source region 230, and a drain connecting region 236 coupling the body region 210 to a drain region 232. Similar to operation in the example configurations of FIGS. 1 and 2, the memory device 200 of FIGS. 3 and 4 provides a first gate induced drain leakage in directions 241 and 243, and a second gate induced drain leakage in directions 242 and 244 that is lower than the first gate induced drain leakage.

In selected embodiments, the addition of a drain connecting region 236 further enhances the memory device 200, and provides reliable biasing of the body region 210 during an erase operation, and also reliable charge maintenance in the body region 210 during a boost operation. In memory device configurations such as the substantially "U" shaped configuration of memory device 200, forming a second connecting region adjacent to the drain is straightforward, and may be desirable. Other configurations, such as where a drain is buried beneath a body region, may only use a single connecting region such as connecting region 234, adjacent to the source region 230.

Figure 5:
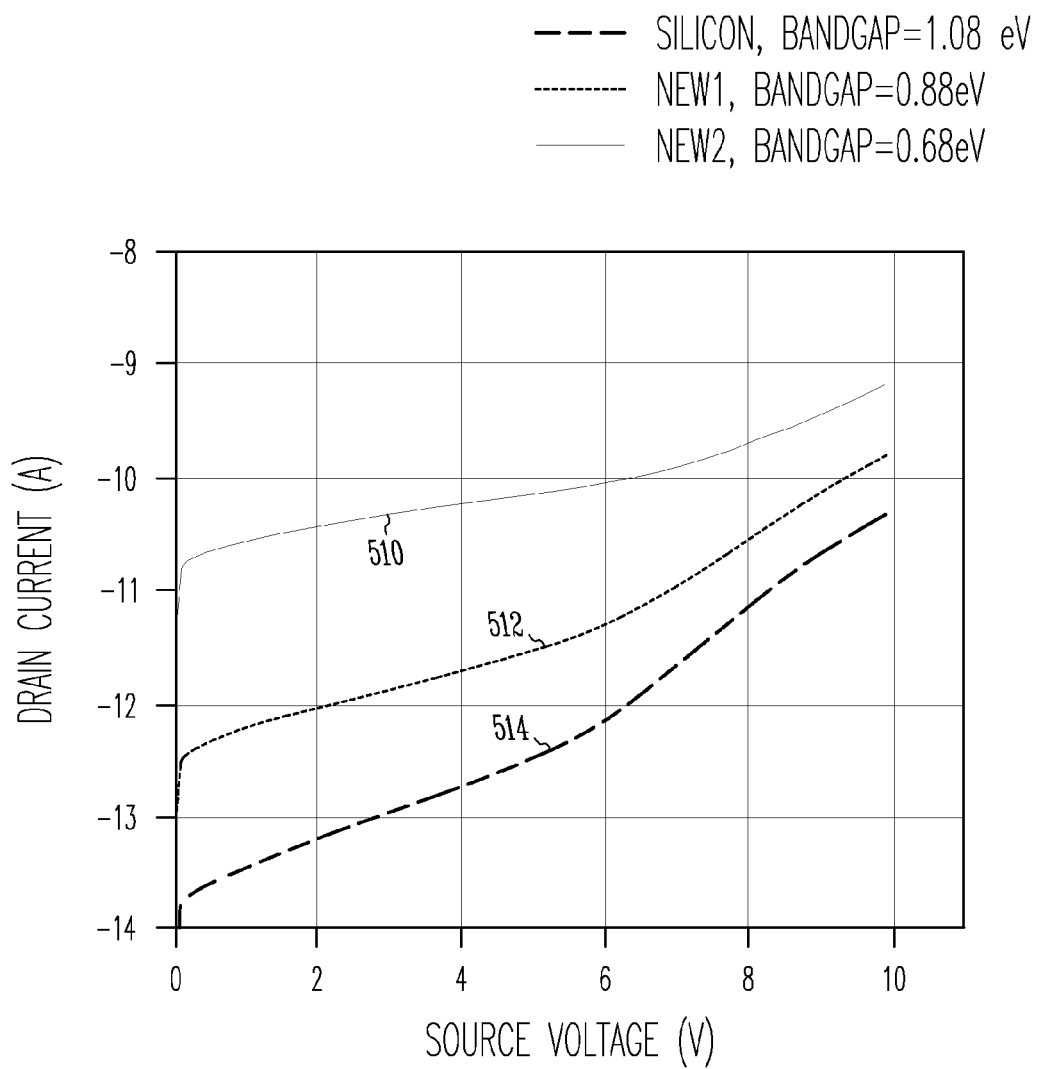
FIG. 5 shows simulated gate induced drain leakage during an erase operation according to an embodiment of the invention.

FIG. 5 shows a simulation line 510 of gate induced drain leakage where a source select gate is only adjacent to a silicon body region (band gap estimated at 1.08 eV for this simulation). Line 512 illustrates gate induced drain leakage of a configuration according to embodiments described above where a source select gate is also adjacent to a source connecting region having a bandgap of 0.88 eV. Line 514 illustrates gate induced drain leakage of a configuration according to embodiments described above where a source select gate is also adjacent to a source connecting region having a band gap of 0.68 eV. As can be seen from the Figure, the addition of a connecting region with a lower band gap than silicon provides a significant increase in gate induced drain leakage during an erase operation, for example.

Figure 6:
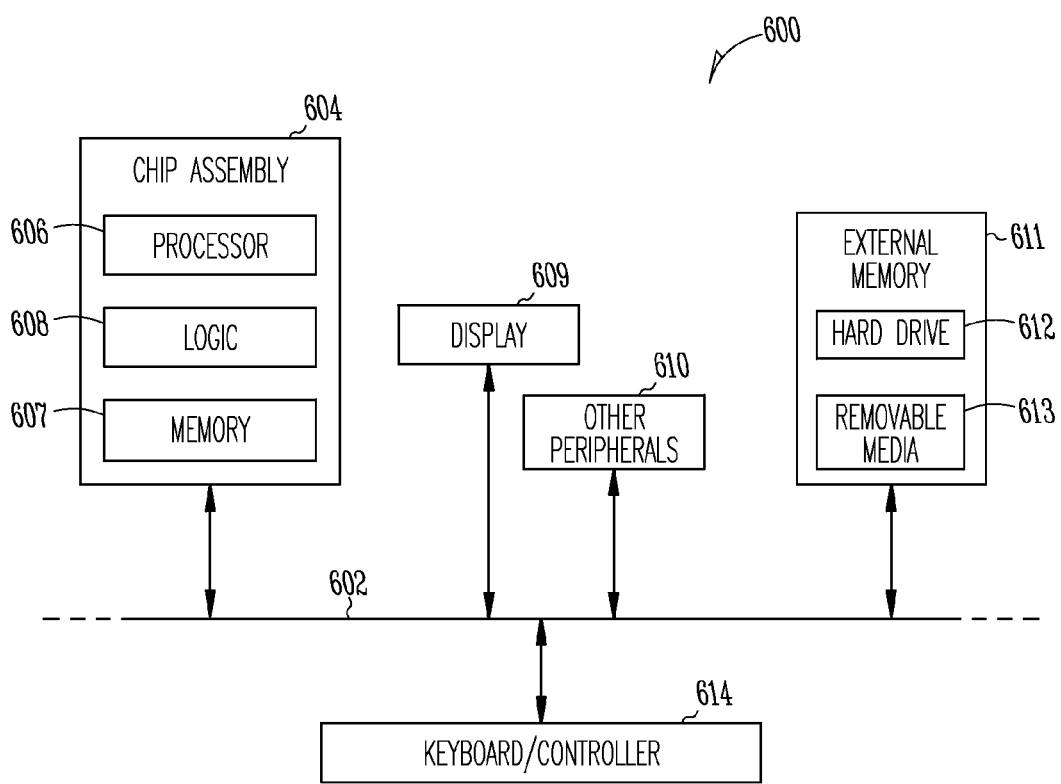
FIG. 6 shows an information handling system using a memory device according to an embodiment of the invention.

An embodiment of an information handling system such as a computer is included in FIG. 6 to show an embodiment of a high-level device application for the present invention. FIG. 6 is a block diagram of an information handling system 600 incorporating a memory device according to embodiments of the invention as described above. Information handling system 600 is merely one embodiment of an electronic system in which decoupling systems of the present invention can be used. Other examples include, but are not limited to, tablet computers, cameras, personal data assistants (PDAs), cellular telephones, MP3 players, aircraft, satellites, military vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory device 607 is included in the chip assembly 604. In one embodiment, the memory device 607 includes a NAND memory device according to embodiments described above.

In one embodiment, additional logic chips 608 other than processor chips are included in the chip assembly 604. An example of a logic chip 608 other than a processor includes an analog to digital converter. Other circuits on logic chips 608 such as custom circuits, an application-specific integrated circuit (ASIC), etc. are also included in one embodiment of the invention.

Information handling system 600 may also include an external memory 611, which in turn can include one or more memory elements suitable to the particular application, such as one or more hard drives 612, and/or one or more drives that handle removable media 613 such as compact disks (CDs), flash drives, digital video disks (DVDs), and the like. A semiconductor memory die constructed as described in examples above is included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A memory device, comprising:
a body region comprising a semiconductor having a first band gap;
a source region coupled to a first end of the body region, and a drain region coupled to a second end of the body region;
a plurality of gates along a length of the body region, each of the plurality of gates being separated from the body region by at least a respective charge storage structure;
a connecting region comprising a semiconductor having a second band gap, the second band gap being lower than the first band gap, the connecting region coupling the source region to the body region; and
a source select gate adjacent to the body region and the connecting region.

2. The memory device of claim 1, wherein the body region is oriented vertically.

3. The memory device of claim 1, wherein the body region is oriented horizontally.

4. The memory device of claim 1, wherein the body region forms a "U" shape with upward facing ends.

5. The memory device of claim 1, wherein the body region comprises doped silicon.

6. The memory device of claim 5, wherein the body region comprises p type silicon.

7. The memory device of claim 1, wherein the connecting region comprises a semiconductor chosen from group consisting of germanium, gallium antimonide, indium nitride, indium arsenide, lead sulfide, lead selenide, lead telluirde, and silicon germanium.

8. The memory device of claim 1, wherein the connecting region is directly coupled to the source region and wherein the connecting region is directly coupled to the body region.

9. The memory device of claim 1, wherein the body region comprises silicon and the connecting region comprises silicon germanium.

10. The memory device of claim 9, wherein the silicon germanium region comprises epitaxial silicon germanium.

11. The memory device of claim 10, wherein the epitaxial silicon germanium is $Si_xGe_{1-x}$ where x is approximately 0.5.

12. The memory device of claim 1, wherein the connecting region comprises a source connecting region, and further comprising:
a drain connecting region comprising a semiconductor having a band gap lower than the first band gap, the drain connecting region coupling the drain region to the body region; and
a drain select gate adjacent to the body region and the drain connecting region.

13. The memory device of claim 12, wherein both the source connecting region and the drain connecting region are formed from the same material.

14. The memory device of claim 12, wherein the drain connecting region comprises silicon germanium.

15. The memory device of claim 1, wherein a gate induced drain leakage current in the body region during a boost operation of a string including the body region is low compared to a gate induced drain leakage current in the body region during an erase operation of the string including the body region.

16. The memory device of claim 1, wherein the connecting region is located between the source region and the body region.

17. A memory device, comprising:
a memory cell string including:
a body region comprising a semiconductor having a first band gap, the body region having a first upward facing end and a second upward facing end;
a drain region coupled to the first upward facing end;
a source region coupled to the second upward facing end;
a plurality of gates along a length of the body region;
a connecting region comprising a semiconductor having a second band gap, the second band gap being lower than the first band gap, the connecting region coupling the source region to the body region;
a source select gate adjacent to the body region and the connecting region; and
a data line coupled to the drain region; and
a source line coupled to the source region.

18. The memory device of claim 17, wherein the connecting region comprises silicon germanium.

19. The memory device of claim 17, wherein the connecting region comprises $Si_xGe_{1-x}$ where x is approximately 0.5.

20. The memory device of claim 17, wherein the connecting region comprises epitaxial $Si_xGe_{1-x}$.

21. The memory device of claim 17, wherein the body region comprises p-doped silicon.

22. The memory device of claim 17, wherein the source region is shared with an adjacent memory cell string.

23. The memory device of claim 17, wherein the memory cell string is substantially U shaped.

24. The memory device of claim 17, wherein each of the gates is shared with an adjacent memory cell string.

25. The memory device of claim 17, wherein each of the gates substantially surrounds a respective cross section of the body region.

26. The memory device of claim 17, wherein the body region comprises an elongated body region.

27. The memory device of claim 17, wherein a first portion of the gates are shared with a first adjacent memory cell string and wherein a second portion of the gates are shared with a second adjacent memory cell string.

* * * * *

UNITED STATES PATENT AND TRADEMARK OFFICE
CERTIFICATE OF CORRECTION

PATENT NO. : 8,431,961 B2
APPLICATION NO. : 13/020337
DATED : April 30, 2013
INVENTOR(S) : Haitao Liu et al.

It is certified that error appears in the above-identified patent and that said Letters Patent is hereby corrected as shown below:

Title Page, Item (75), under "Inventors", column 1, line 2, delete "IA" and insert -- ID --, therefor.

In the Claims:

In column 6, line 2, in Claim 7, delete "telluirde," and insert -- telluride, --, therefor.

Signed and Sealed this
Twenty-fifth Day of June, 2013

Teresa Stanek Rea
*Acting Director of the United States Patent and Trademark Office*